United States Patent
Lee et al.

(10) Patent No.: US 9,529,392 B2
(45) Date of Patent: Dec. 27, 2016

(54) WATERPROOF DOOR ASSEMBLY OF ELECTRONIC DEVICE

(71) Applicant: GETAC TECHNOLOGY CORPORATION, Hsinchu County (TW)

(72) Inventors: Kun-Cheng Lee, Taipei (TW); Juei-Chi Chang, Taipei (TW)

(73) Assignee: Getac Technology Corporation, Hsinchu County (TW)

( * ) Notice: Subject to any disclaimer, the term of this patent is extended or adjusted under 35 U.S.C. 154(b) by 281 days.

(21) Appl. No.: 14/248,536

(22) Filed: Apr. 9, 2014

(65) Prior Publication Data

US 2014/0368994 A1 Dec. 18, 2014

Related U.S. Application Data

(60) Provisional application No. 61/834,551, filed on Jun. 13, 2013.

(30) Foreign Application Priority Data

Oct. 18, 2013 (CN) .......................... 2013 1 0493121

(51) Int. Cl.
*G06F 1/16* (2006.01)
*H05K 5/06* (2006.01)
*E06B 7/22* (2006.01)

(52) U.S. Cl.
CPC ............. *G06F 1/1656* (2013.01); *H05K 5/061* (2013.01); *H05K 5/068* (2013.01); *E06B 7/22* (2013.01)

(58) Field of Classification Search
CPC ............ H05K 5/061; H05K 5/068; E06B 7/22
See application file for complete search history.

(56) References Cited

U.S. PATENT DOCUMENTS

| | | | | |
|---|---|---|---|---|
| 7,713,091 | B2 * | 5/2010 | Chen ...................... | H01R 31/06 439/630 |
| 7,789,437 | B2 * | 9/2010 | Sheng ................... | G06F 1/1658 292/137 |
| 8,434,833 | B2 * | 5/2013 | Hsu ......................... | G06F 1/187 312/223.2 |

(Continued)

FOREIGN PATENT DOCUMENTS

| DE | 20 2006 007 400 U1 | 8/2006 |
|---|---|---|
| JP | 2010113137 A * | 5/2010 |

Primary Examiner — Zachary M Pape
Assistant Examiner — Douglas Burtner

(57) ABSTRACT

A waterproof door assembly of an electronic device having an opening with an annulus wall includes a fastening element formed on the electronic device, a waterproof door having a door panel pivotally coupled to the electronic device and a replaceable ring, and a switch flipping element. A bump and an engaging portion are extended from opposite sides of the door panel respectively. The replaceable ring is sheathed on the periphery of the bump; the switch flipping element slides on the door panel. The switch flipping element has a snapping portion and a fastening portion for performing a multi-stage position adjustment to latch the fastening portion to the corresponding fastening element. The bump is inserted into the opening, and the replaceable ring is clamped between the annulus wall and the bump to maintain high sealing performance and long service life of the waterproof door.

11 Claims, 7 Drawing Sheets

(56) References Cited

U.S. PATENT DOCUMENTS

| | | | |
|---|---|---|---|
| 8,764,073 B2* | 7/2014 | Lin | E05B 17/002 |
| | | | 277/637 |
| 9,282,659 B2* | 3/2016 | Lee | H05K 5/0221 |
| 2006/0007647 A1* | 1/2006 | Peng | G06F 1/1656 |
| | | | 361/679.55 |
| 2009/0256364 A1* | 10/2009 | Gadau | G06F 1/1616 |
| | | | 292/128 |
| 2011/0211300 A1* | 9/2011 | Mori | G06F 1/1656 |
| | | | 361/679.01 |
| 2013/0044420 A1* | 2/2013 | Iwamoto | H01R 13/447 |
| | | | 361/679.01 |
| 2013/0163159 A1* | 6/2013 | Mack | G06F 1/1656 |
| | | | 361/679.01 |
| 2013/0235538 A1* | 9/2013 | Hashimoto | H05K 5/06 |
| | | | 361/752 |
| 2014/0152890 A1* | 6/2014 | Rayner | G06F 1/1626 |
| | | | 348/376 |
| 2014/0370739 A1* | 12/2014 | Lee | H01M 2/1066 |
| | | | 439/366 |

* cited by examiner

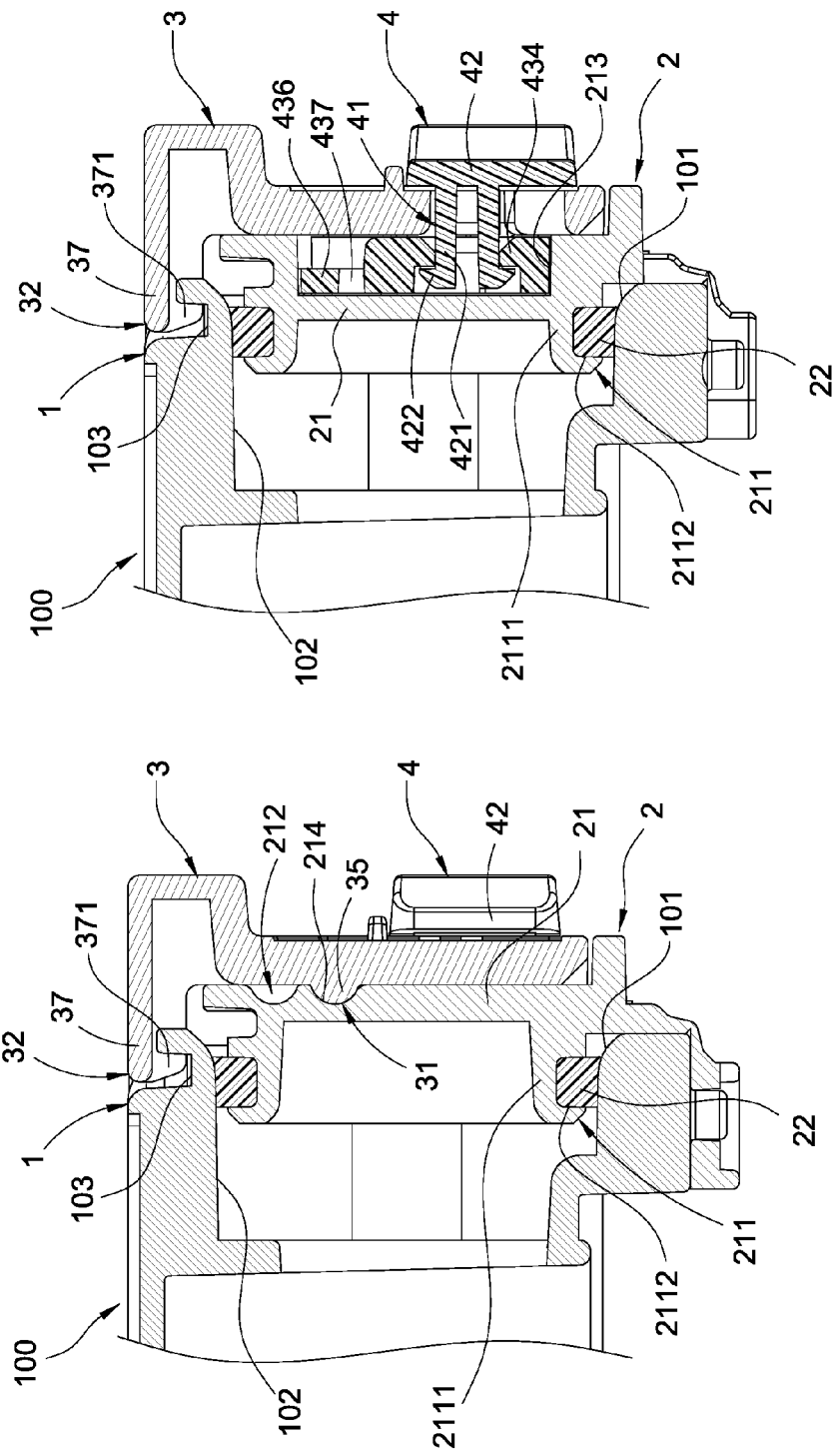

WATERPROOF DOOR ASSEMBLY OF ELECTRONIC DEVICE

FIELD OF THE INVENTION

The present invention relates to a cover panel for covering an opening, and more particularly to a waterproof door assembly of an electronic device.

BACKGROUND OF THE INVENTION

As computer technologies and hardware architecture are developed rapidly, notebook computers have become a mainstream of the market. To provide consumers a better upgradability, extension or expansion, manufacturers introduce models that allow users to expand the hardware equipments by themselves, and the aforementioned models come with an opening that serves as a reserved space in a casing for the consumers to install, utilize or remove peripheral hardware devices.

On the other hand, a cover panel is provided for covering the opening formed on the surface of the casing in order to prevent dust or water from entering into the casing, and the cover panel can achieve the effects of opening and closing the opening. As disclosed in U.S. Pat. No. 7,789,437, a lockable door assembly applied in a notebook computer and fixed onto a housing of the notebook computer, and a waterproof gasket is attached onto an inner side of a door, so that the waterproof gasket can cover a position of the door and seal the opening to provide a convenient opening operation and dustproof and waterproof functions.

However, the patented technology as disclosed in U.S. Pat. No. 7,789,437 has the following drawbacks: Firstly, it is necessary to change the whole set of door if the waterproof gasket is damaged or deteriorated, and thus incurring a high maintenance and repair cost. Secondly, the waterproof gasket covers a relatively large area of the inner side of the door, so that if thermal expansion or contraction partially happens to the waterproof gasket, the waterproof gasket will be deformed to reduce the sealing performance and service life of the door.

In view of the aforementioned drawbacks of the prior art, the inventor of the present invention based on years of experience in the related industry to conduct extensive researches and experiments, and finally designed a feasible solution to overcome the drawbacks of the prior art.

SUMMARY OF THE INVENTION

Therefore, it is a primary objective of the present invention to provide a waterproof door assembly of an electronic device, wherein a replaceable ring is provided for replacement in order to maintain the high sealing performance and long service life of the waterproof door.

To achieve the aforementioned objectives, the present invention provides a waterproof door assembly of an electronic device, and the electronic device includes an opening and an annular wall disposed at the internal periphery opening of the opening, and the waterproof door assembly comprises:

a fastening element, formed on the electronic device;
a waterproof door, comprising:
a door panel, pivotally coupled to the electronic device, and disposed at a position corresponding to the opening, and having a bump and an engaging portion extended from two opposite sides of the door panel;
a replaceable ring, sheathed on the periphery of the bump; and
a switch flipping element, coupled to and sliding on the door panel, and having a snapping portion and a fastening portion, such that the switch flipping element can slide and drive the snapping portion and the engaging portion to perform a multi-stage position adjustment, so as to latch the fastening portion to the corresponding fastening element, and the bump is inserted into the opening, and the replaceable ring is clamped between the annular wall and the bump.

The present invention has the following effects:

(1) The replaceable ring is clamped between the annular wall and the bump, so that the waterproof door has a high waterproof performance.

(2) The replaceable ring can be installed to or removed from the bump, so that if the replaceable ring is damaged or deteriorated, the replaceable ring can be removed from the bump for a replacement, so that the waterproof door of the present invention has the advantage of a low maintenance and repair cost.

(3) The replaceable ring is sheathed on the periphery of the bump, so that when thermal expansion or contraction partially happens to the replaceable ring, the replaceable ring is also supported by the bump to prevent deformation, so that the waterproof door has a high waterproof performance.

(4) The waterproof door is limited by the design of being latched by the switch flipping element and the fastening element, so that when thermal expansion or contraction happens to the replaceable ring, and the door panel is pushed and squeezed, the waterproof door is latched by the switch flipping element and the fastening element to prevent the waterproof door from being loosened.

(5) The waterproof door assembly of the present invention further comprises a lock for selectively locking or releasing the switch flipping element, so that if the waterproof door assembly is triggered by mistake, vibrated or hit, the switch flipping element will still be restricted by the lock without producing a sliding movement, so that the waterproof door still covers the opening securely to provide an excellent protection of the electronic device.

(6) The multi-stage position adjustment of the snapping portion and the engaging portion is the first locking measure for the waterproof door assembly, and the design of limiting the switch flipping element by the lock is the second locking measure for the waterproof door assembly, and thus the waterproof door assembly of the present invention has two locking measures to enhance the structural strength and protection capability of the waterproof door assembly.

BRIEF DESCRIPTION OF THE DRAWINGS

FIG. 4 is a sectional view of a waterproof door assembly of the present invention;

FIG. 5 is another sectional view of a waterproof door assembly of the present invention;

DESCRIPTION OF THE PREFERRED EMBODIMENTS

The technical contents of the present invention will become apparent with the detailed description of preferred embodiments accompanied with the illustration of related drawings as follows. It is intended that the embodiments and figures disclosed herein are to be considered illustrative rather than restrictive.

With reference to FIGS. 1 to 5 for a waterproof door assembly of an electronic device in accordance with the present invention, the waterproof door assembly 10 comprises a fastening element 1, a waterproof door 2 and a switch flipping element 3.

Figure 1:
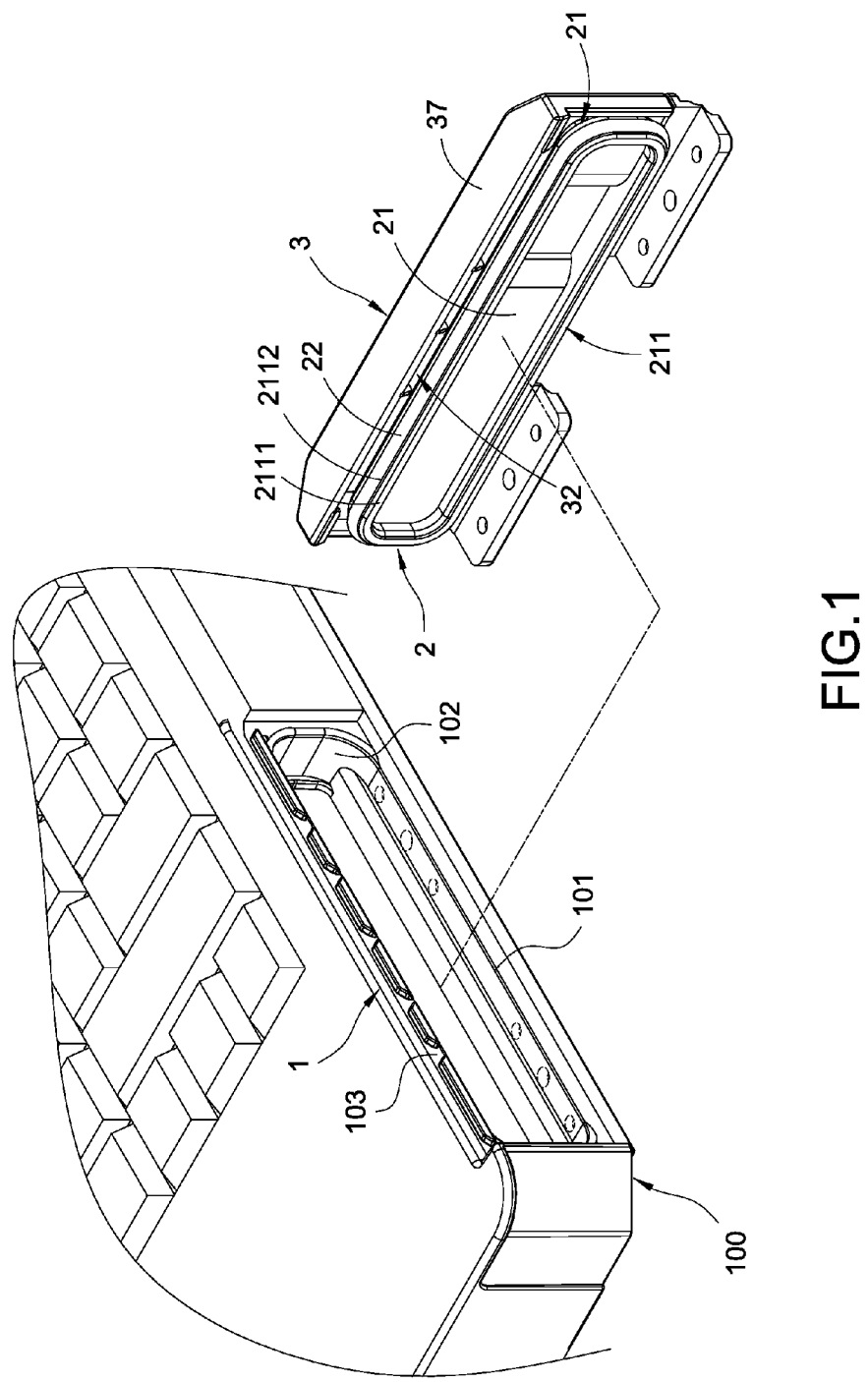
FIG. 1 is an exploded view of a waterproof door assembly of the present invention.

In FIG. 1, the electronic device 100 includes a housing having an opening 101, and an annular wall 102 disposed at the internal periphery of the opening 101. Wherein, the housing is made of plastic or metal, so that the annular wall 102 is also made of plastic or metal.

The fastening element 1 is formed on the electronic device 100. More specifically, the fastening element 1 is comprised of a fastening slot 103 formed on the electronic device 100.

Figure 2:
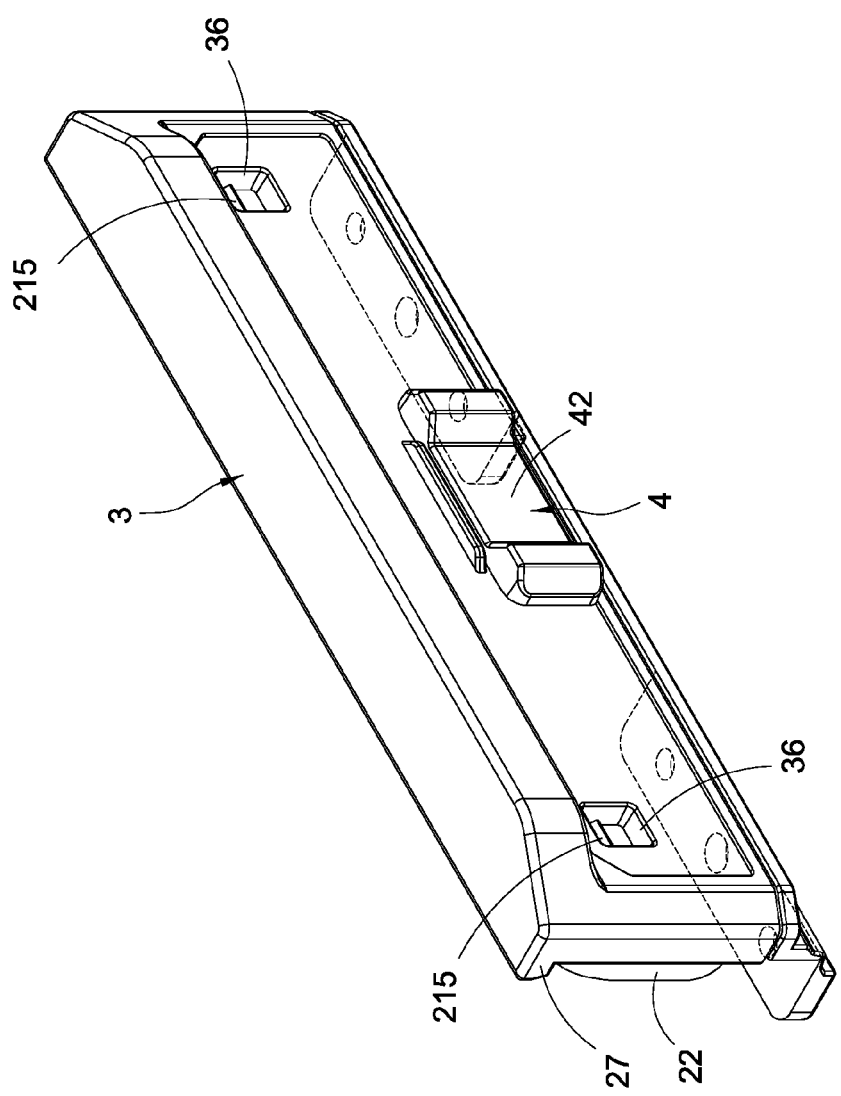
FIG. 2 is a perspective view of a waterproof door assembly of the present invention.
Figure 3:
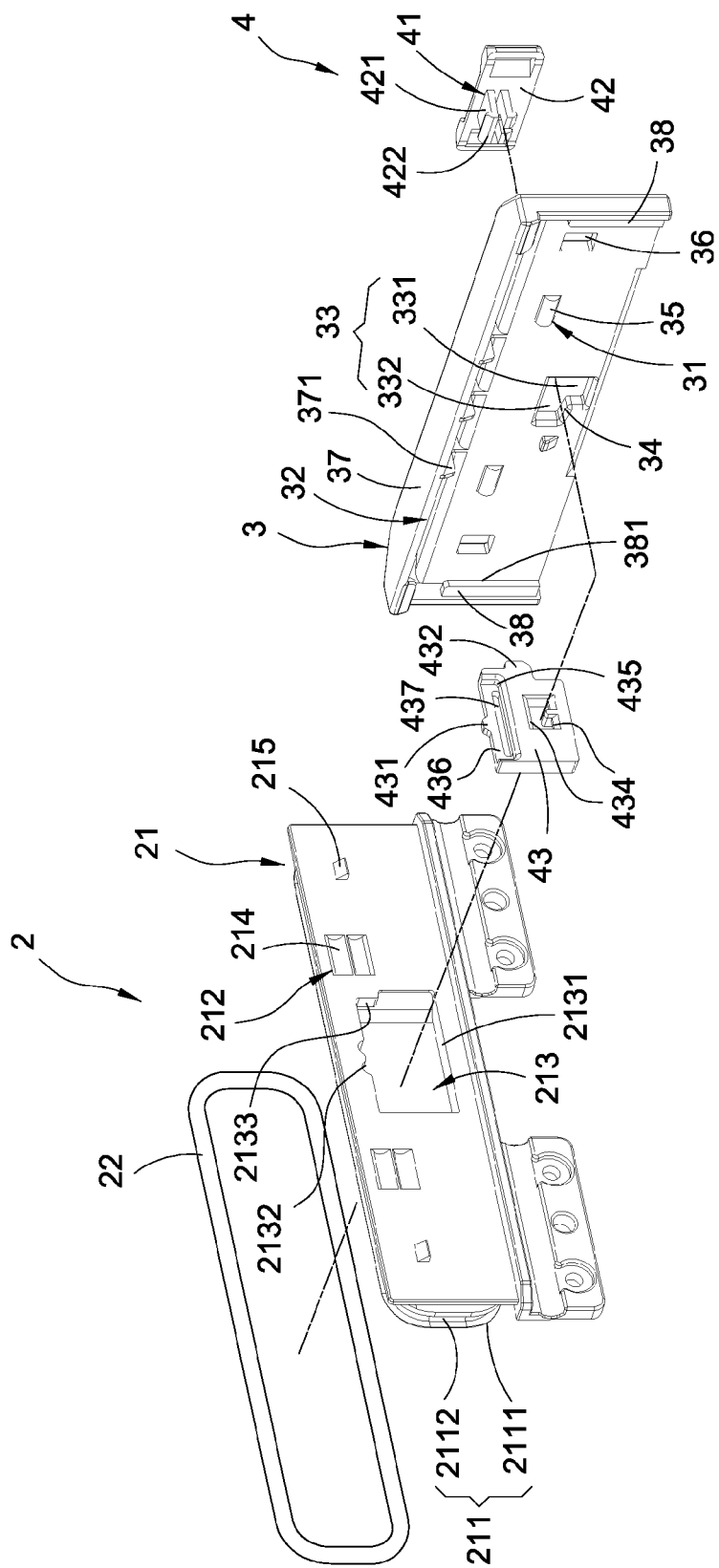
FIG. 3 is an exploded view of a waterproof door of the present invention.

In FIGS. 2 and 3, the waterproof door 2 includes a door panel 21 and a replaceable ring 22. The door panel 21 is pivotally coupled to the electronic device 100 and disposed at a position corresponding to the opening 101. A bump 211 and an engaging portion 212 are extended from two opposite sides of the door panel 21 respectively, and the replaceable ring 22 is sheathed on the periphery of the bump 211, so that the replaceable ring 22 can be installed to or removed from the bump 211. Wherein, the replaceable ring 22 is fixed to a ring-shaped groove 2112.

More specifically, the door panel 21 is made of plastic or metal, so that the bump 211 is also made of plastic or metal. The replaceable ring 22 is made of silicone or rubber. Therefore, the replaceable ring 22, the annulus annular 102 and the bump 211 are made of materials with different coefficients of thermal expansion.

In addition, the bump 211 is a ring-shaped member 2111 extended from the door panel 21, and a ring-shaped groove 2112 is formed at the external periphery of the ring-shaped member 2111.

In addition, the door panel 21 includes a cavity 213. The door panel 21 has a peripheral wall 2131 formed at the periphery of the cavity 213, and the peripheral wall 2131 has a plurality of gaps 2132. Wherein, a first latch edge 2133 is protruded from the peripheral wall 2131.

In addition, the engaging portion 212 has two rows of grooves 214 longitudinally formed on the door panel 21. The door panel 21 has two stopper members 215 extended from two opposite sides of each groove 214 respectively.

In FIGS. 2 to 5, the switch flipping element 3 is coupled to and slid on the door panel 21. The switch flipping element 3 has a snapping portion 31 and a fastening portion 32. When the bump 211 is inserted into the opening 101, the replaceable ring 22 is clamped between the annular wall 102 and the bump 211. Users can slide the switch flipping element 3 to drive the snapping portion 31 and the engaging portion 212 to perform a multi-stage position adjustment, so as to latch the fastening portion 32 to the corresponding fastening element 1 to fix the door panel 21 into position.

Further, the switch flipping element 3 includes a hollow area 33 communicating with the cavity 213. The hollow area 33 includes a first hollow groove 331 and a second hollow groove 332 communicating with each other, and the first hollow groove 331 has a diameter greater than the diameter of the second hollow groove 332. The switch flipping element 3 has a first latch portion 34 corresponding to the hollow area 33 and formed at the periphery of the second hollow groove 332.

In addition, the snapping portion 31 is comprised of two protruding members 35 extended from the switch flipping element 3 and each protruding member 35 selectively latches one of the grooves 214. The switch flipping element 3 has two limit slots 36, and each stopper member 215 can be moved and limited in each limit slot 36 for restricting the switch flipping element 3 to slide with respect to the door panel 21 and preventing the switch flipping element 3 from separating from the door panel 21. The switch flipping element 3 has an extending end 37 extended from the top of the switch flipping element 3. The fastening portion 32 is comprised of an embedding member 371 extended downwardly from the extending end 37. The embedding member 371 is capable of latching the corresponding fastening slot 103.

In addition, the switch flipping element 3 includes a pair of L-shaped retaining walls 38 extended from both sides of the switch flipping element 3 respectively and a sliding track 381 formed in the two L-shaped retaining walls 38. Both sides of the door panel 21 are accommodated in the two L-shaped retaining walls 38, and the switch flipping element 3 can slide with respect to the door panel 21 through the sliding track 381. With the concave and convex structures of the door panel 21 and the switch flipping element 3, the purpose of sliding the switch flipping element 3 with respect to the door panel 21 can be achieved to enhance the smoothness of operating the switch flipping element 3.

It is noteworthy that the groove 214 as shown in FIG. 3 can be arranged in an opposite direction on the switch flipping element 3, and the protruding member 35 can be arranged in an opposite direction on the door panel 21, so that the snapping portion 31 and the engaging portion 212 can perform a multi-stage position adjustment.

Similarly, the stopper member 215 can be arranged in an opposite direction on the switch flipping element 3, and the limit slot 36 is arranged in an opposite direction on the door panel 21, so that each stopper member 215 can be moved and limited in each limit slot 36 to restrict the switch flipping element 3 to slide with respect to the door panel 21 and prevent the switching flipping element 3 from separating from the door pane 121.

In FIGS. 2 to 5, the waterproof door assembly of an electronic device in accordance with the present invention further comprises a lock 4. The lock 4 has a second latch portion 41. The lock 4 is accommodated in the cavity 213 and exposed from the hollow area 33. Users can move the lock 4 through the hollow area 33, so that the second latch portion 41 can latch and fix the corresponding first latch portion 34 to limit the movement of the switch flipping element 3.

More specifically, the lock 4 has a flip element 42 moving in the hollow area 33 and exposed from the hollow area 33. The second latch portion 41 is comprised of a snap-in member 421 extended from the flip element 42. When the snap-in member 421 slides into the first hollow groove 331, the switch flipping element 3 moves with respect to the snap-in member 421 through the first hollow groove 331. When the snap-in member 421 slides into the second hollow groove 332, the switch flipping element 3 is limited by the snap-in member 421 through the second hollow groove 332.

In addition, the lock 4 includes a linking element 43 moving in the cavity 213 and jointly operating with the flip element 42. The linking element 43 has a latch 431 extended from the top of the linking element 43 for selectively latching one of the gaps 2132.

In addition, a second latch edge 432 is protruded from one of the left and right sides of the linking element 43, and the second latch edge 432 is capable of latching the corresponding first latch edge 2133. The linking element 43 includes an accommodating slot 433 and two flanges 434 extended from the interior of the accommodating slot 433. The snap-in member 421 has a pair of hooks 422 extended from an end of the snap-in member 421. The snap-in member 421 is passed through the accommodating slot 433, so that the pair of hooks 422 and the two flanges 434 are engaged with each other, and the flip element 42 and the linking element 43 can be operated jointly.

In addition, the linking element 43 has a pit 435 formed on a side of the linking element 43 and a bottom plate 436 formed at the bottom of the pit 435. The latch 431 is formed at an end portion of the bottom plate 436, and the bottom plate 436 has a transverse through hole 437 formed at a position corresponding to the latch 431. Since the latch 431 is formed on the bottom plate 436, and the bottom plate 436 has the transverse through hole 437 corresponding to the latch 431, therefore when the latch 431 is pressed, the latch 431 can be deformed slightly in the direction towards the transverse through hole 437 to provide a smooth operation of latching the latch 431 to one of the gaps 2132.

In addition, the periphery of the flip element 42 is greater than the periphery of the hollow area 33, so that the switch flipping element 3 is limited between the door panel 21 and the flip element 42, and each stopper member 215 can be moved and limited in each limit slot 36 to allow the switch flipping element 3 to slide with respect to the door panel 21. In addition, the switch flipping element 3 is limited, such that it will not be separated from the door panel 21 easily.

In the waterproof door assembly 10 of the present invention, the fastening element 1 is formed on the electronic device 100. The door panel 21 is pivotally coupled to the electronic device 100 and disposed at a position corresponding to the opening 101. The door panel 21 includes the bump 211 and the engaging portion 212 extended from two opposite sides of the door panel 21 respectively. The replaceable ring 22 is sheathed on the periphery of the bump 211. The switch flipping element 3 is coupled to and slid on the door panel 21. The switch flipping element 3 includes the snapping portion 31 and the fastening portion 32, so that the switch flipping element 3 can slide to drive the snapping portion 31 and the engaging portion 212 to perform a multi-stage position adjustment, so as to latch the fastening portion 32 to the corresponding fastening element 1. The bump 211 is inserted into the opening 101. The replaceable ring 22 is clamped between the annular wall 102 and the bump 211. Therefore, the replaceable ring 22 can be replaced to maintain the high sealing performance and the long service life of the waterproof door 2.

In FIGS. 4 and 5, the replaceable ring 22 is clamped between the annular wall 102 and the bump 211, so that the waterproof door 2 has a high waterproof performance.

In addition, the replaceable ring 22 can be installed to or removed from the bump 211, so that if the replaceable ring 22 is damaged or deteriorated, it is not necessary to replace the whole set of the waterproof door 2, but only the replaceable ring 22 is removed from the bump 211 for replacement. Therefore, the waterproof door 2 of the present invention has the advantage of a low maintenance and repair cost.

In addition, the conventional waterproof gasket covers a relatively large area of the inner side of the door, so that if thermal expansion or contraction partially happens to the waterproof gasket, the waterproof gasket will be deformed to reduce the sealing performance and the service life of the door. On the other hand, the replaceable ring 22 of the present invention is sheathed on the periphery of the bump 211. Therefore, if thermal expansion or contraction happens to the replaceable ring 22, the replaceable ring 22 also will be supported by the bump 211 to prevent deformation, so that the waterproof door 2 has a high waterproof performance.

In addition, the coefficients of thermal expansion of the replaceable ring 22, the annular wall 102, and the bump 211 are different. When thermal expansion or contraction happens to the replaceable ring 22, the elasticity of the replaceable ring 22 will push and squeeze the waterproof door 2. However, the waterproof door 2 is limited by the design of being latched by the switch flipping element 3 and the fastening element 1, so that when thermal expansion or contraction happens to the replaceable ring 22 and the door panel 21 is pushed and squeezed by the replaceable ring 22, the waterproof door 2 will be limited by the design of being latched by the switch flipping element 3 and the fastening element 1 to prevent the waterproof door 2 from being loosened.

Figure 7:
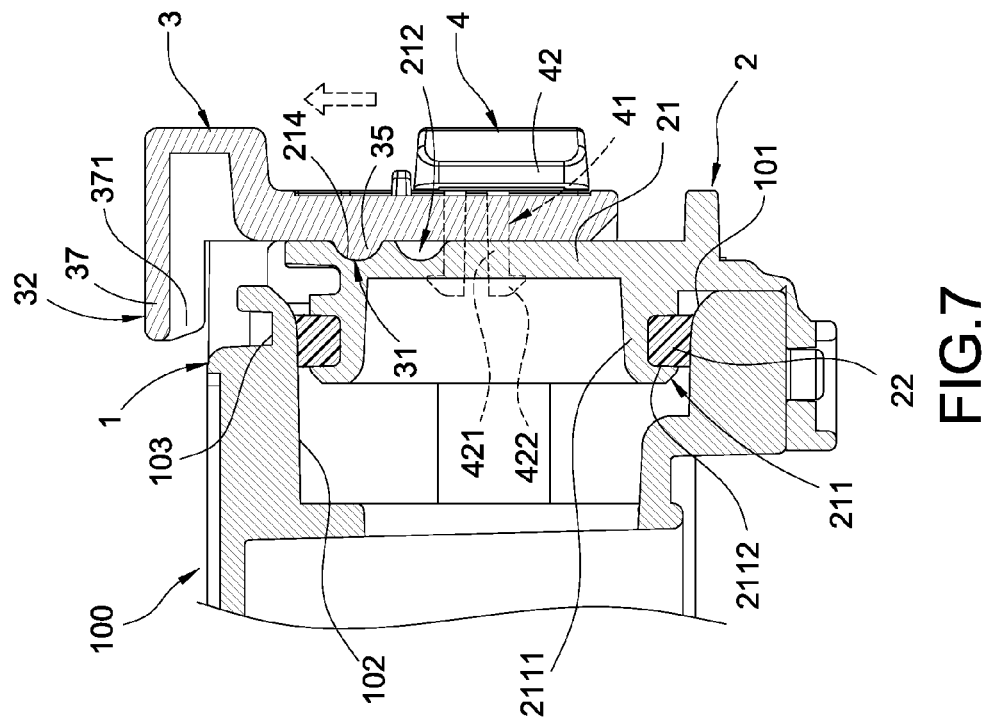
FIG. 7 is a schematic view of a second using status of a waterproof door assembly of the present invention.
Figure 6:
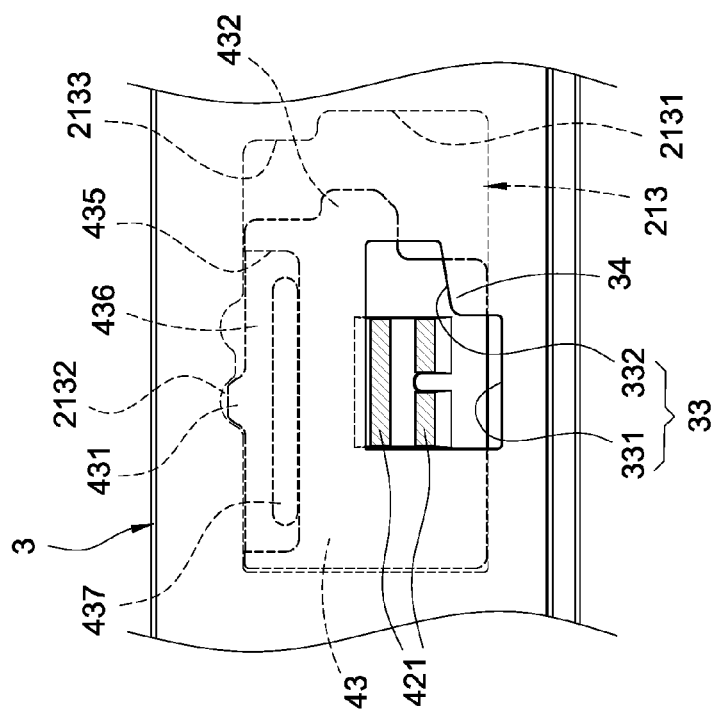
FIG. 6 is a schematic view of a first using status of a waterproof door assembly of the present invention.
Figure 8:
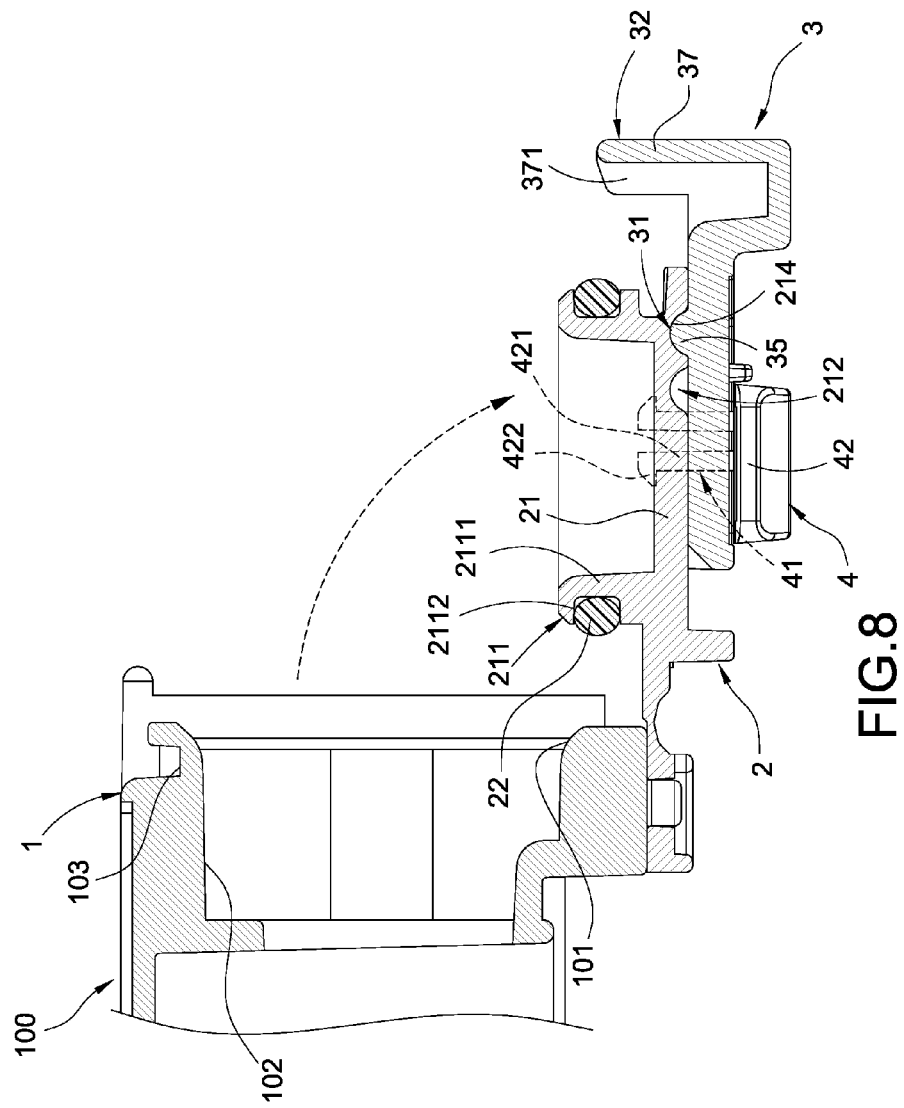
FIG. 8 is a schematic view of a third using status of a waterproof door assembly of the present invention.

With reference to FIGS. 6 to 9 for the using status of the waterproof door assembly 10 of the present invention, FIGS. 6 to 8 show that when a snap-in member 421 slides into the first hollow groove 331, the switch flipping element 3 slides upwardly with respect to the snap-in member 421 through the first hollow groove 331. The protruding member 35 selectively latches a groove 214 at the top. The switch flipping element 3 drives the fastening portion 32 to separate from the corresponding fastening element 1, so that the waterproof door assembly 10 is exposed from the opening 101.

Figure 9:
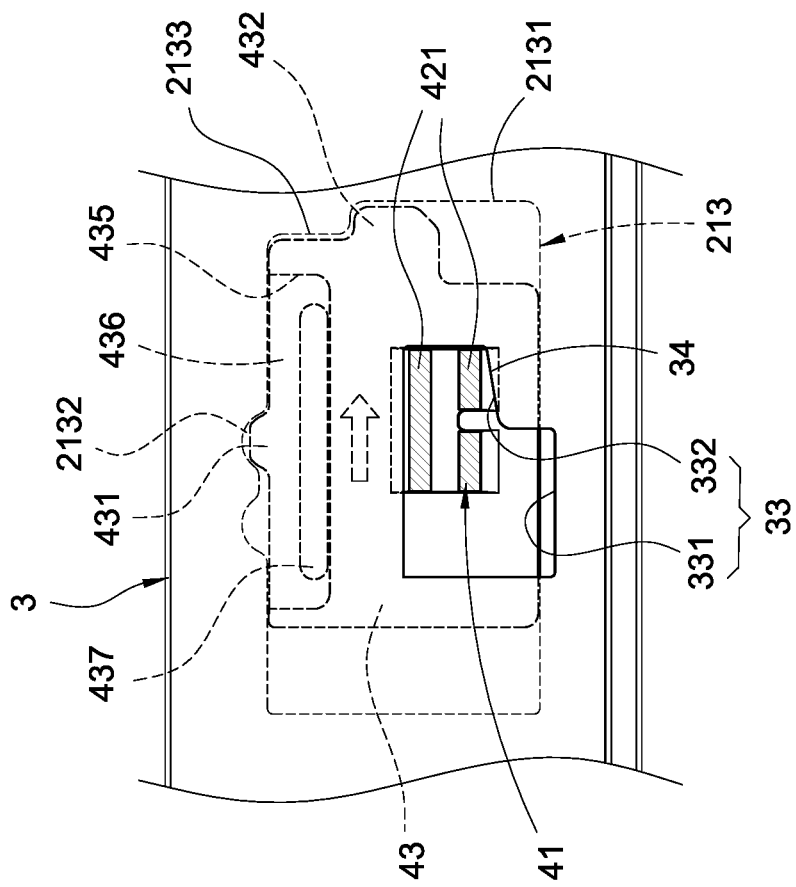
FIG. 9 is a schematic view of a fourth using status of a waterproof door assembly of the present invention.

In FIGS. 9 and 5, when the switch flipping element 3 slides downwardly, and the snap-in member 421 slides into the second hollow groove 332, the switch flipping element 3 is limited by the snap-in member 421 through the second hollow groove 332. The protruding member 35 selectively latches the groove 214 at the bottom. The switch flipping element 3 drives the fastening portion 32 to latch the corresponding fastening element 1, so that the waterproof door assembly 10 is securely covered onto the opening 101.

In addition, when the waterproof door assembly 10 is securely covered onto the opening 101, the bump 211 is inserted into the opening 101, so that the replaceable ring 22 is filled between the annular wall 102 and the bump 211, and the replaceable ring 22 is clamped and stuffed between the annular wall 102 and the bump 211 to achieve a high waterproof performance of the waterproof door 2.

In the meantime, the replaceable ring 22 can be installed to or removed from the bump 211, so that if the replaceable ring 22 is damaged or deteriorated, it is necessary to replace the old replaceable ring 22 by removing it from the bump 211 and then reinstalling a brand new replaceable ring 22 to the bump 211 to complete the replacement of the replaceable ring 22. Therefore, the waterproof door 2 of the present invention has the advantage of a low maintenance and repair cost.

In addition, the coefficients of thermal expansion of the replaceable ring 22, the annular wall 102, and the bump 211 are different, so that if thermal expansion or contraction happens to the replaceable ring 22, the elasticity of the replaceable ring 22 will push and squeeze the waterproof door 2. However, the waterproof door 2 is restricted by the design of being latched by the switch flipping element 3 and the fastening element 1, so that the waterproof door assembly 10 can be covered onto the opening 101 securely.

More specifically, if thermal expansion or contraction happens to the replaceable ring 22, then the replaceable ring 22 will push and squeeze the waterproof door 2 along the axial direction of the opening 101. However, the multi-stage position adjustment of the snapping portion 31 and the engaging portion 212 is performed in the radial direction of the opening 101 (or the switch flipping element 3 slides in the radial direction of the opening 101) to control the waterproof door assembly 10 to be exposed from the opening 101 or covered onto the opening 101.

If thermal expansion or contraction happens to the replaceable ring 22 and leads the replaceable ring 22 to push and squeeze the door panel 21, the pushing force of the replaceable ring 22 exerted onto the door panel 21 and the force applied to the door panel 21 by the switch flipping element 3 are perpendicular to each other, so that the pushing force of the replaceable ring 22 exerted onto the door panel 21 and the force applied to the door panel 21 by the switch flipping element 3 will not interfere with one another. As a result, the switch flipping element 3 is still latched securely to the fastening element 1 without being interfered by the force applied to the door panel 21, and when thermal expansion or contraction happens to the replaceable ring 22 and leads the replaceable ring 22 to push and squeeze the door panel 21, the waterproof door 2 can be prevented from being loosened from the opening 101, so as to improve the sealing performance and protective function of the waterproof door 2.

In addition, the waterproof door assembly 10 of the present invention further comprises a lock 4. The door panel 21 includes a cavity 213. The switch flipping element 3 includes a hollow area 33 communicating with the cavity 213 and a first latch portion 34 disposed at a position corresponding to the hollow area 33. The lock 4 includes a second latch portion 41. The lock 4 is accommodated in the cavity 213 and exposed from the hollow area 33. Users can move the lock 4 through the hollow area 33 to latch and fix the second latch portion 41 to the corresponding first latch portion 34, so as to limit the movement of the switch flipping element 3. The lock 4 can selectively latch or release the switch flipping element 3 to restrict the switch flipping element 3 from sliding with respect to the waterproof door 2 and provide a protective mechanism to prevent the waterproof door assembly 10 from being triggered by mistake. If the waterproof door assembly 10 is triggered by mistake, vibrated or hit, the switch flipping element 3 is still limited by the lock 4 to prevent its sliding. Therefore, the waterproof door 2 is still covered securely onto the opening 101 to achieve an excellent protective effect of the electronic device 100.

In addition, the multi-stage position adjustment of the snapping portion 31 and the engaging portion 212 provides a first locking measure for the waterproof door assembly 10. The design of limiting the switch flipping element 3 by the lock 4 provides a second locking measure for the waterproof door assembly 10. Therefore, the waterproof door assembly 10 of the present invention has two locking measures to enhance the structural strength and protection capability of the waterproof door assembly 10.

In summation of the description above, the present invention achieves the expected objectives and overcomes the drawbacks of the prior art, and the invention complies with patent application requirements, and is thus duly filed for patent application.

While the invention has been described by means of specific embodiments, numerous modifications and variations could be made thereto by those skilled in the art without departing from the scope and spirit of the invention set forth in the claims.

What is claimed is:

1. A waterproof door assembly of an electronic device, and the electronic device having an opening and an annular wall disposed around the internal periphery of the opening, comprising:
    a fastening element, formed on the electronic device;
    a waterproof door, comprising:
        a door panel, pivotally coupled to the electronic device, disposed at a position corresponding to the opening, and having a bump, a cavity, and an engaging portion extended from two opposite sides of the door panel respectively, wherein the bump is inserted into the opening; and
        a replaceable ring, sheathed on the periphery of the bump, wherein the replaceable ring is clamped between the annular wall and the bump;
    a switch flipping element, coupled to and sliding on the door panel, and having a snapping portion and a fastening portion, such that the switch flipping element can be slid to drive the snapping portion and the engaging portion to perform a multi-stage position adjustment so as to latch the fastening portion to the corresponding fastening element, wherein the switch flipping element has a hollow area communicating with the cavity and a first latch portion disposed at a position corresponding to the hollow area; and
    a lock having a second latch portion, the lock being accommodated in the cavity and exposed from the hollow area such that the hollow area can move the lock to latch and fix the second latch portion to the corresponding first latch portion, so as to limit the movement of the switch flipping element;
    wherein the lock includes a flip element moving in and exposed from the hollow area, and the second latch portion has a snap-in member extended from the flip element, and the hollow area has a first hollow groove and a second hollow groove communicating with each other, and the first hollow groove has a diameter greater than a diameter of the second hollow groove, and the first latch portion is formed at a periphery of the second hollow groove, and the snap-in member slides into the first hollow groove so that the switch flipping element can move the snap-in member through the first hollow groove, and the snap-in member slides into the second hollow groove so that the switch flipping element is limited by the snap-in member through the second hollow groove.

2. The waterproof door assembly of an electronic device according to claim 1, wherein the lock includes a linking element moving in the cavity and operated jointly with the flip element, and a latch extended from the top of the linking element, and the door panel has a peripheral wall opposite to a periphery of the cavity, and the peripheral wall has a plurality of gaps, and the latch selectively latches one of the gaps.

3. The waterproof door assembly of an electronic device according to claim 2, further comprising a second latch edge protruded from the peripheral wall, and a first latch edge protruded from one of the left and right sides of the linking element, and the first latch edge being provided for latching the corresponding second latch edge.

4. The waterproof door assembly of an electronic device according to claim 2, wherein the linking element includes an accommodating slot and two flanges extended from the interior of the accommodating slot, and a pair of hooks are extended from an end of the snap-in member, and the snap-in member is passed into the accommodating slot, and the pair of hooks and the two flanges are latched with one another.

5. The waterproof door assembly of an electronic device according to claim 2, wherein the linking element has a pit formed on a side of the linking element, and a bottom plate formed at the bottom of the pit, and the latch is formed at an end portion of the bottom plate, and the bottom plate includes a transverse through hole formed at a position corresponding to the latch.

6. The waterproof door assembly of an electronic device according to claim 1, wherein the bump is a ring-shaped member and a ring-shaped groove is formed at the external periphery of the ring-shaped member and provided for fixing the replaceable ring therein.

7. The waterproof door assembly of an electronic device according to claim 1, wherein the replaceable ring is made of silicone or rubber, and the coefficients of thermal expansion of the replaceable ring and the annular wall are different.

8. The waterproof door assembly of an electronic device according to claim 1, wherein the engaging portion is comprised of two rows of grooves longitudinally formed on the door panel, and the snapping portion is comprised of two protruding members extended from the switch flipping element, and each protruding member selectively latches one of the grooves.

9. The waterproof door assembly of an electronic device according to claim 8, wherein the door panel has two stopper members extended from both external sides opposite to the grooves, and the switch flipping element has two limit slots for limiting the stopper members therein respectively.

10. The waterproof door assembly of an electronic device according to claim 1, wherein the fastening element includes a fastening slot formed at the top of the electronic device, and the switch flipping element has an extending end extended from the top of the switch flipping element, and the fastening portion is comprised of an embedding member extended downwardly from the extending end, and the embedding member is provided for latching the fastening slot.

11. The waterproof door assembly of an electronic device according to claim 1, wherein the switch flipping element includes a pair of opposite L-shaped retaining walls, and a sliding track formed in the two L-shaped retaining walls, and both sides of the door panel are accommodated in the two L-shaped retaining walls, and the switch flipping element is capable of sliding with respect to the door panel through the sliding track.

* * * * *